United States Patent [19]

Sakumoto et al.

[11] Patent Number: 5,032,438
[45] Date of Patent: Jul. 16, 1991

[54] ADHESIVE TAPES FOR DIE BONDING

[75] Inventors: Yukinori Sakumoto; Atsushi Koshimura; Masaki Tsushima, all of Shizuoka, Japan

[73] Assignee: Tomoegawa Paper Co., Ltd., Tokyo, Japan

[21] Appl. No.: 356,768

[22] Filed: May 25, 1989

[30] Foreign Application Priority Data

May 28, 1988 [JP] Japan .................................. 63-131077

[51] Int. Cl.$^5$ ...................... B32B 7/12; B32B 15/04; B32B 31/00
[52] U.S. Cl. ...................................... 428/40; 428/337; 428/339; 428/352; 156/247
[58] Field of Search ............... 428/352, 343, 337, 339, 428/40; 156/247

[56] References Cited

U.S. PATENT DOCUMENTS 4,761,335  8/1988  Aurichio et al. .................... 428/352
4,873,140 10/1989  McIntyre ............................ 428/343

FOREIGN PATENT DOCUMENTS 1168443  7/1989  Japan ................................. 428/352

Primary Examiner—George F. Lesmes
Assistant Examiner—D. R. Zirker
Attorney, Agent, or Firm—Cushman, Darby & Cushman

[57] ABSTRACT

An adhesive tape for die bonding is disclosed, comprising a release film having a release layer on at least one side of a support and an adhesive layer attached to said release layer, wherein the exposed surface of said adhesive layer is a mirror-like surface having an average roughness on center line (Ra) of not more than 2.5 μm and a maximal height (Rmax) of not more than 20 μm.

4 Claims, 2 Drawing Sheets

ADHESIVE TAPES FOR DIE BONDING

FIELD OF THE INVENTION

This invention relates to the improvement of an adhesive tape for die bonding, which is used for attaching a semiconductor element to a lead frame.

BACKGROUND OF THE INVENTION

In the field of semiconductor devices such as transistors, etc., various bonding methods have been developed for incorporating semiconductor chips in packages and practically used.

In these methods, a technique called die bonding is used to attach a semiconductor chip to a definite position of a substrate for the purposes of ensuring the mechanical connection, electrical connection, heat dissipation, etc. of chips to packages, and is practically performed in the following manners.

(a) Eutectic crystal alloy method: A connection method of scrubbing an Au surface as a conductor surface to which an Si chip is attached with respect to the back surface of the Si chip while heating to about 400° C. to thereby effect alloying by an Au-Si eutectic crystal. However, this method is very expensive due to the use of gold.

(b) Resin bonding method: A method of bonding a chip subjected to a back surface treatment with a pasty adhesive containing a thermosetting resin such as an epoxy resin, etc. and a filler such as Ag, Au, $SiO_2$, MgO, etc. However, in this method, there is required a long period of time for curing the resin although the mounting work can be performed at ambient temperatures. Also, this method has a disadvantage that the pasty adhesive is inferior in workability because a predetermined amount thereof must be weighed and also the adhesive creates tacky circumstances. Furthermore, such a pasty adhesive has a shortcoming that silver powder is separated by sedimentation during the storage of the paste.

In order to solve the above problems, it has been conceived to provide a die bonding tape comprising an adhesive layer laminated on a release film. More particularly, the die bonding tape is a continuous adhesive tape which comprises an adhesive layer composed mainly of a thermosetting resin and a filler and a release film and which is wound on a reel.

Exemplary as thermosetting resins for the adhesive layer are epoxy resins, polyimide resins, phenolic resins, polyamide resins, silicone resins, etc. as well as modified resins thereof, which form a three-dimensional structure with predetermined amounts of hardeners through crosslinking by heating.

The electroconductive fillers to be added to the resins are powders of metals such as gold, silver, copper, nickel, rhodium, palladium, etc. which pass #100 mesh, preferably #300 mesh. Non-electroconductive fillers include metal oxides such as MgO, $Al_2O_3$ and $SiO_2$. All of these fillers are effective in preventing softening by heat or shrinkage.

In the case of epoxy resins, used as hardeners are acid anhydrides, imidazoles, dicyandiamide, amines, etc. and optionally silane coupling agents, etc.

On the other hand, useful as release films are films and papers release-treated with silicone resins, etc. which include films of polyethylene terephthalate, polypropylene and fluoroplastics. These release-treated films or papers are characterized in that although they are attached to the aforementioned adhesives they are easily removable. The release treatment may be made either to the single side or to both sides of the film or paper, but the treatment to both sides may be preferred.

Practical adhesive tapes for die bonding are about 50 to 100 m long, about 1 to 8 mm wide (this width corresponding to the sizes of semiconductor chips) and about 30 to 150 μm thick, preferably 40 to 100 μm thick. Of the above thickness, the adhesive layer has a thickness of about 10 to 50 μm, preferably 20 to 30 μm, while the release film has a thickness of about 20 to 100 μm, and a release-treated polyethylene terephthalate tape having a thickness of 25 to 75 μm (standard being 38 μm) is usually used.

When winding the above adhesive tapes for die bonding on reels, a preferred winding manner for preventing the inside from contamination is such that the release film faces the outside although either of the adhesive layer and release film may face the outside.

However, no special care has been exercised to the state of the surface of the adhesive layer, and the conventional tapes for die bonding have physical surfaces common to ordinary tapes or films. As a result, the conventional tapes for die bonding have a shortcoming that voids tend to generate in the adherent interface between the surface of the adhesive layer and the die pad when the adhesive layer is bonded to the die pad of a lead frame by pressing a heat rod on the back of the release film by way of heat transfer. And, the voids once formed between the lead frame and the surface of the tape may result in the following troubles:

(1) the voids tend to collect water, solvents, etc. and cause steam explosion by heat stock thereby generating cracks in the lead frame, etc.; and (2) the bond strength between the lead frame and the surface of the tape for die bonding is insufficient.

Consequently, because of the above-mentioned reasons, the reliability of the semiconductor device decreases.

SUMMARY OF THE INVENTION

After a diligent study to solve the above problems, the present inventors have achieved the invention by finding that the problems are solved by rendering the surface of the adhesive layer mirror-like.

The excellent bonding without generating voids between the surface of the die pad and the adhesive layer has been obtained under conditions where the mirror-like surface of the adhesive layer of the adhesive tape for die bonding has an average roughness on center line (hereinafter referred to as Ra) of not more than 2.5 μm, preferably 0.5 to 2.3 μm, and a maximal height (hereinafter referred to as Rmax) of not more than 20 μm, preferably 3.0 to 15.5 μm as measured in accordance with JIS B 0601 Method for measuring surface roughness.

Incidentally, conventional adhesive tapes for die bonding which have undergone no treatment for rendering the surface mirror-like have an average roughness on center line (Ra) of 2.7 to 5.1 μm and a maximal height (Rmax) of 28.0 to 57.5 μm.

And, according to the present invention, the surface of adhesive tape for die bonding is rendered mirror-like by passing conventional adhesive tapes having a release film attached thereon through hot rolls of 80° to 140° C.

DETAILED DESCRIPTION OF THE INVENTION

Figure 1:
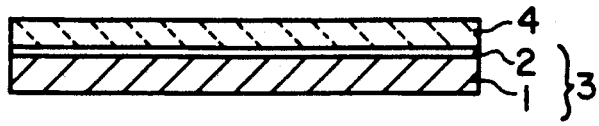
FIGS. 1 and 2 are each an enlarged sectional view of the adhesive tape for die bonding of the present invention.
Figure 2:
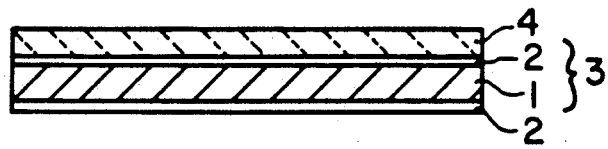

As in FIG. 1, where the tapes are supplied in sheets, support 1 has on one side thereof release layer 2 to form release film 3. As in FIG. 2, where the tapes are supplied in a form of wound rolls, the support 1 needs to be provided with release layer 2 on both sides thereof to form release film 3. Numeral 4 represents an adhesive layer which has been attached through the release layer 2 and which has an exposed surface having the aforementioned Ra and Rmax values as a result of treatment to provide a mirror-like surface.

Figure 3:
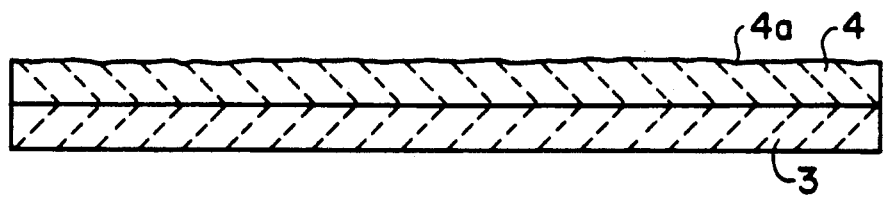
FIGS. 3, 4, 5 and 6 are each a sectional view to illustrate the presence or absence of the mirror-like surface.

As an explanation to distinguish the tape of the present invention from the conventional one, FIG. 3 illustrates the state of a tape without treatment for a mirror-like surface where there are combined the adhesive layer 4 and release film 3 which is a both-side release coated polyethylene terephthalate film. Noticeably, the surface of the adhesive layer 4 is represented by rough surface 4a having a microscopically jagged state.

Figure 4:
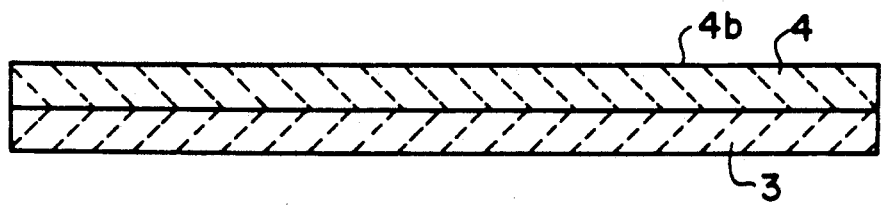
Figure 5:
Figure 6:

FIG. 4 illustrates the state of the tape of the present invention with the same codes for the corresponding parts of FIG. 3 but showing the formation of mirror-like surface 4b on the surface of the adhesive layer 4. Accordingly, removing the release films 3 from the tapes of FIGS. 3 and 4 gives FIGS. 5 and 6, respectively. It will be noted that the adhesive layer 4 from the conventional tape as indicated in FIG. 5 provides a difference in smoothness between the front and reverse sides of the layer.

Figure 7A:
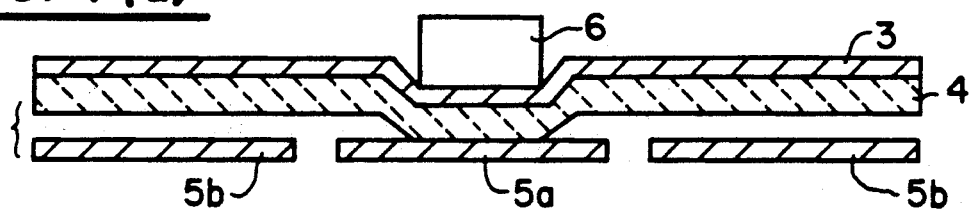
FIGS. 7(a) and (b) are each a sectional view to illustrate the step of bonding to the die pad.

The use of the adhesive tape for die bonding of the present invention by heat-transfer method is made in the following procedure: hold the tape such that the adhesive layer 4 faces downward, place the adhesive layer 4 on die pad 5a of the lead frame, and press rod 6, at a temperature of 100° to 150° C. onto the release film 3 as illustrated in FIG. 7(a).

In the above procedure, owing to the mirror-like surface of the adhesive layer 4, the adherent interface between the die pad 5a and the adhesive layer 4 does not admit the involvement of air and thus suppresses void formation. Besides, numeral 5b represents a lead pin of the lead frame.

Figure 7B:
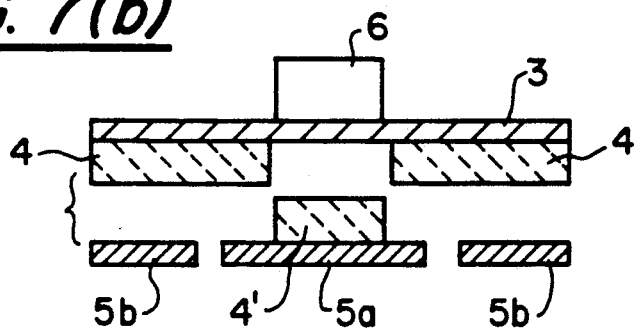

After removal of the pressure of the heat rod 6, as illustrated in FIG. 7(b), according to the state of the surface of the rod 6, transferred adhesive layer 4' is selectively transferred onto the die pad 5a so that the unpressed part of the adhesive layer 4 remains attached to the release film 3.

Figure 8:
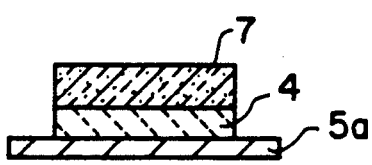
FIG. 8 is a schematic view illustrating the state of a bonded semiconductor chip.

Next, as illustrated in FIG. 8, semiconductor chip 7 is mounted on the adhesive layer 4 of the die pad 5a obtained according to the step of FIGS. 7(a) and (b). In the above case, the side of the adhesive layer 4 brought into contact with the semiconductor 7 is naturally mirror-like because it is separated from the release film surface which has been processed by lamination to a mirror-like surface. Consequently, any void does not develop in the interface between the semiconductor chip 7 and the adhesive layer 4.

Example 1

A coating composition for an adhesive as indicated in Table 1 was sufficiently dispersed in a sand mill; thereafter it was applied to a release film composed of a 38 μm thick polyethylene terephthalate tape, both sides of which had been previously treated with a silicone resin releasing agent, and dried according to the condition indicated in Table 2.

TABLE 1

| Ingredients | Parts by weight |
| --- | --- |
| Silver Powder (#67 made METZ Co., Ltd.) | 100 |
| Epoxy Resin (Epikote ® #1001 made by Yuka Shell Co., Ltd.) | 20 |
| Polyester (Vylon ® 300 made by Toyobo Co., Ltd.) | 20 |
| Phenolic Resin (Tamanol ® 752 made by Arakawa Chemical Co., Ltd.) | 15 |
| Imidazole (2PZ made by Shikoku Fine Chemical Co., Ltd.) | 0.5 |
| Solvent (Methyl Ethyl Ketone) | 100 |

TABLE 2

|   | Item | Conditions |
| --- | --- | --- |
| 1. | Thickness of Coating | 20 μm |
| 2. | Drying Conditions | |
|   | Temperature | 120° C. |
|   | Time | 10 minutes |

The tape made according to the above process is a conventional adhesive tape for die bonding without treatment for rendering it mirror-like.

The above tape was passed through heat rolls of 100° C. to obtain the mirror state having an Ra of 1.1 and an Rmax of 5.4 to produce an adhesive tape for die bonding of the present invention.

Next, according to the step as illustrated in FIGS. 7 and 8, an adhesive layer of the adhesive tape was heat-transferred onto a die pad of lead frame at 120° C., on which a semiconductor chip being mounted on the adhesive layer and bonded at 150° C. As a result of observation of voids, it was confirmed that the formation of voids had been markedly reduced in the adherent interface between the adhesive layer of the tape of the present invention and the die pad.

Example 2

A coating composition for an adhesive as indicated in Table 3 was sufficiently dispersed in a sand mill; thereafter it was applied to a release film composed of a 2.5 μm thick polyethylene terephthalate tape, both sides of which had been previously treated with a silicone resin releasing agent, and dried according to the condition indicated in Table 4.

TABLE 3

| Ingredients | Parts by weight |
| --- | --- |
| Silver Powder (TCGI made by Tokuriki Chemical Co., Ltd.) | 100 |
| Epoxy Resin (YDPN601 made by Tohto Kasei Co., Ltd.) | 23 |
| Polyester (Vylon ® 300 made by Toyobo Co., Ltd.) | 15 |
| Phenolic Resin (PR-13349 made by Sumitomo Durez Co., Ltd.) | 15 |

TABLE 3-continued

| Ingredients | Parts by weight |
| --- | --- |
| Imidazole (2P4BHZ made by Shikoku Fine Chemical Co., Ltd.) | 0.3 |
| Solvent (Methyl Ethyl Ketone) | 100 |

TABLE 4

| | Items | Conditions |
| --- | --- | --- |
| 1. | Thickness of Coating | 25 μm |
| 2. | Drying Conditions | |
| | Temperature | 120° C. |
| | Time | 10 minutes |

The tape made according to the above process is a conventional adhesive tape for die bonding without treatment for rendering it mirror-like. The above tape was passed through heat rolls of 100° C. to obtain the mirror state having an Ra of 0.9 and an Rmax of 3.7 to produce an adhesive tape for die bonding of the present invention.

Next, according to the step as illustrated in FIGS. 7 and 8, an adhesive layer of the adhesive tape was heat-transferred onto a die pad of a lead frame at 120° C., on which a semiconductor chip was mounted and bonded at 150° C. As a result of observation of voids, it was confirmed that the formation of voids had been markedly reduced in the adherent interface between the adhesive layer of the tape of the present invention and the die pad.

As described in the above example, according to the present invention, there is provided an adhesive tape for die bonding which exhibits an excellent adhesion due to no involvement of air in the adherent interface between a lead frame and a semiconductor chip and which allows the die bonding at a lower temperature and in a shorter time. The above-mentioned effect is realized by rendering mirror-like the exposed surface of the adhesive layer which constitutes the adhesive tape for die bonding, i.e., the surface which is to be brought into contact with the lead frame.

While the invention has been described in detail and with reference to specific embodiments thereof, it will be apparent to one skilled in the art that various changes and modifications can be made therein without departing from the spirit and scope thereof.

What is claimed is:

1. An adhesive tape for die bonding comprising:
a release film having a release layer on at least one side of a support layer; and
an adhesive layer of a thermosetting adhesive that contains an electroconductive filler attached to said release layer, wherein an exposed surface of said adhesive layer is formed so as to be a mirror-like surface having an average roughness on center line (Ra) of not more than 2.5 μm and a maximum height of (Rmax) of not more than 20 μm.

2. An adhesive tape as in claim 1, wherein the mirror-like surface has an average roughness on center line (Ra) of 0.5 to 2.3 μm and a maximum height (Rmax) of 3.0 to 15.5 μm.

3. An adhesive tape as in claim 1, wherein said adhesive layer is mainly includes a thermosetting resin.

4. An adhesive tape as in claim 3, wherein said adhesive layer further includes a filler.

* * * * *